United States Patent
Al-Ghamdi et al.

(10) Patent No.: US 9,647,223 B2
(45) Date of Patent: May 9, 2017

(54) SINGLE LAYER NANOCOMPOSITE PHOTORESPONSE DEVICE

(71) Applicant: King Abdulaziz University, Jeddah (SA)

(72) Inventors: Ahmed A. Al-Ghamdi, Jeddah (SA); Yusuf Al-Turki, Jeddah (SA); Fahrettin Yakuphanoglu, Elazig (TR); Farid El-Tantawy, Ismailia (EG)

(73) Assignee: King Abdulaziz University, Jeddah (SA)

( * ) Notice: Subject to any disclaimer, the term of this patent is extended or adjusted under 35 U.S.C. 154(b) by 2 days.

(21) Appl. No.: 14/789,622

(22) Filed: Jul. 1, 2015

(65) Prior Publication Data
US 2017/0005283 A1     Jan. 5, 2017

(51) Int. Cl.
*H01L 51/42*     (2006.01)
*H01L 51/00*     (2006.01)

(52) U.S. Cl.
CPC ...... *H01L 51/4233* (2013.01); *H01L 51/0003* (2013.01); *H01L 51/0073* (2013.01); *H01L 51/4213* (2013.01); *H01L 2251/303* (2013.01)

(58) Field of Classification Search
CPC .................. H01L 51/4213; H01L 51/4233
See application file for complete search history.

(56) References Cited

U.S. PATENT DOCUMENTS

| | | | |
|---|---|---|---|
| 6,649,824 B1* | 11/2003 | Den | H01L 31/03682 136/250 |
| 2010/0027192 A1 | 2/2010 | Perry et al. | |
| 2011/0041980 A1* | 2/2011 | Kim | H01L 51/441 156/60 |
| 2013/0269766 A1* | 10/2013 | Park | H01L 51/4213 136/256 |
| 2014/0054442 A1 | 2/2014 | Huang et al. | |
| 2014/0263945 A1* | 9/2014 | Huang | H01L 51/428 250/200 |

OTHER PUBLICATIONS

Ruankham, P. et al. "Surface Modification of ZnO Nanorods with Small Organic Molecular Dyes for Polymer-Inorganic Hybrid Solar Cells." J. Phys. Chem. 115 (Oct. 2011), 23809-23816.*
Chen, L. "Si-Based ZnO Ultraviolet Photodiodes." Photodiodes—From Fundamentals to Applications, pp. 195-213. Intech 2012.*
(Continued)

*Primary Examiner* — Eduardo A Rodela
*Assistant Examiner* — Christopher M Roland
(74) *Attorney, Agent, or Firm* — Oblon, McClelland, Maier & Neustadt, L.L.P.

(57) ABSTRACT

A photoresponse device comprising a nanocomposite photoactive material is provided. The photoactive layer comprises a nanocomposite material of metal oxide nanoparticles dispersed within a photosensitizing organic semiconductor formed on a substrate. Methods of characterizing the nanocomposites are provided and demonstrate commercially relevant electrical and photodetection properties, particularly the ability to operate as a photodiode, photoconductor or photocapacitor. An economical process for preparing the nanocomposite and the photoresponse device is also provided as well as applications.

19 Claims, 8 Drawing Sheets

(56) References Cited

OTHER PUBLICATIONS

Yakuphanoglu, F. et al. "Novel Organic Doped Inorganic Photosensors." Microelectronic Engineering 160 (2016), 27-33.*

Wang, J. T-W., et al., "Low-Temperature Processed Electron Collection Layers of Graphene/TiO2 Nanocomposites in Thin Film Perovskite Solar Cells", NANO Letters, URL: http://www.elp.uji.es/recursos/paper213.pdf, PP. A-G, (Nov. 2013).

Guo, F., et al., "A nanocomposite ultraviolet photodetector based on interfacial trap-controlled charge injection", Nature Nanotechnology, vol. 7, pp. 798-802, (Dec. 2012).

* cited by examiner

SINGLE LAYER NANOCOMPOSITE PHOTORESPONSE DEVICE

TECHNICAL FIELD

The present invention relates generally to the field of photoresponse devices. More particularly, the present invention relates to photoresponse devices featuring a photoactive nanocomposite layer suitable for converting light into current and the economic preparation of such photoresponse devices.

DESCRIPTION OF THE RELATED ART

The "background" description provided herein is for the purpose of generally presenting the context of the disclosure. Work of the presently named inventors, to the extent it is described in this background section, as well as aspects of the description which may not otherwise qualify as prior art at the time of filing, are neither expressly or impliedly admitted as prior art against the present invention.

Semiconductor-based photoresponse devices have been continuously developed that can be widely used in various commercial, civilian and military areas. Applications include medicine, defense and solid-state electronics including optical communications, optoelectronic devices, optical sensors, computer components, photovoltaics, photodiodes, missile launching detection, flame detection, radiation calibration and monitoring, chemical and biological analysis and astronomical studies.

Generally, photoresponse devices or photodetectors comprise p-n junctions that when illuminated by light photons excite electrons causing free electrons and holes to be generated. The built in electric field at the depletion region causes electrons to move toward the cathode and the holes to move toward the anode, producing a measurable photocurrent that can be detected and read out in a variety of manners.

Photoresponse devices have included silicon, silicon carbide, and gallium nitride p-n junctions. New combinations of organic and inorganic materials that can interact with incident light are sought for interesting electrical and optical applications. Metal oxide semiconductor nanoparticles are one such material. These nanoparticles have been synthesized by high cost processes and equipment including co-sputtering, molecular beam epitaxilation (MBE), laser ablation, and chemical vapor deposition (CVD) techniques. In addition to expense these methods have limitation relating to the to the control of nanosize and morphology.

The present disclosure describes improved and highly sensitive photoresponse devices with high responsivity, fast response time and good signal-to-noise ratio. The present disclosure further describes improved methods for producing photoresponse devices including photoactive nanocomposite layers at a relatively low cost. In one aspect of the present disclosure a photoactive nanocomposite layer having improved photoresponse properties and a corresponding photoactive nanocomposite layer are described to provide a photoresponse device meeting relevant techno commercial specifications produced with desirable process economics.

BRIEF SUMMARY OF THE INVENTION

The foregoing paragraphs have been provided by way of general introduction, and are not intended to limit the scope of the following claims. The described embodiments, together with further advantages, will be best understood by reference to the following detailed description taken in conjunction with the accompanying drawings.

In a first aspect, the present invention relates to photoactive materials for use in a photoresponse device that efficiently converts light into current. The photoactive layer of the photoresponse device becomes more electrically conductive due to the absorption of electromagnetic radiation such as solar light.

In general, the photoresponse device includes a cathode, an anode and a photoactive layer comprising a suitable substrate layer and a nanocomposite layer of organic semiconductor matrix with electron trapping nanoparticles dispersed throughout the matrix formed on the substrate. The photoactive layer is disposed or sandwiched between the anode and cathode with the cathode in continuous contact with the substrate and the anode in continuous contact with the nanocomposite.

In a preferred embodiment: the cathode is a low work function metal, preferably aluminum, the anode is a high work function metal, preferably gold and the substrate layer is p-type semiconductor, preferably p-type doped silicon (Si). In a preferred embodiment, the nanocomposite layer is metal oxide nanoparticles, preferably zinc oxide (ZnO) nanorods, dispersed in a photosensitizing organic semiconductor matrix, preferably coumarin. The molar ratios of the metal oxide nanoparticles to the organic semiconductor are in the range of 1:500-1:5.

The presence of the nanoparticles imparts significant optical and electrical properties to the photoactive layer and the photoresponse device. When the photoresponse device is illuminated by light, the photoactive layer produces electrons and holes via interactions of the light and the materials comprising the photoactive layer. The nanoparticles serve as electron trapping particles, and the current flowing through the photoresponse device is increased. In essence, the photoactive nanocomposite layer and substrate layer form a heterojunction between p-Si and photosensitized n-ZnO with interfacial-trap controlled charge injection.

In a first instance, when the photoresponse device is not illuminated by light, it operates as a photodiode possessing a Schottky rectifying contact. The Schottky photodiode can be controlled using incident light and voltage simultaneously. In a second instance, when the photoresponse device is illuminated by light, it operates in a first photoconductor mode and a second photocapacitor mode, both possessing an Ohmic contact. The photoconductor and photocapacitor can be controlled using incident light and voltage or frequency simultaneously.

When illuminated the photoresponse device exhibits a high photocurrent gain ($I_{photo}/I_{dark}$) of at least 3000 at 4V and a responsivity of at least 0.1 A/W as a photodiode. In addition, when illuminated the photoresponse device exhibits a high photocapacitance gain ($C_{photo}/C_{dark}$) of at least 60 at 10 kHz.

In a second aspect, the present invention relates to a process for forming the nanocomposite photoactive layer material and photoresponse device described above. The method is a simple, mild, efficient, economical and commercially viable application of hydrothermal assisted sol-gel techniques. In a preferred embodiment, the zinc oxide nanorods are sourced from zinc nitrate hexahydrate and urea, mixed with coumarin and coated onto the surface of the p-type silicon substrate by a drop casting method.

In a third aspect, the present invention relates to the applications of the photoresponse device and electronic devices comprising or utilizing the photoresponse device described herein.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
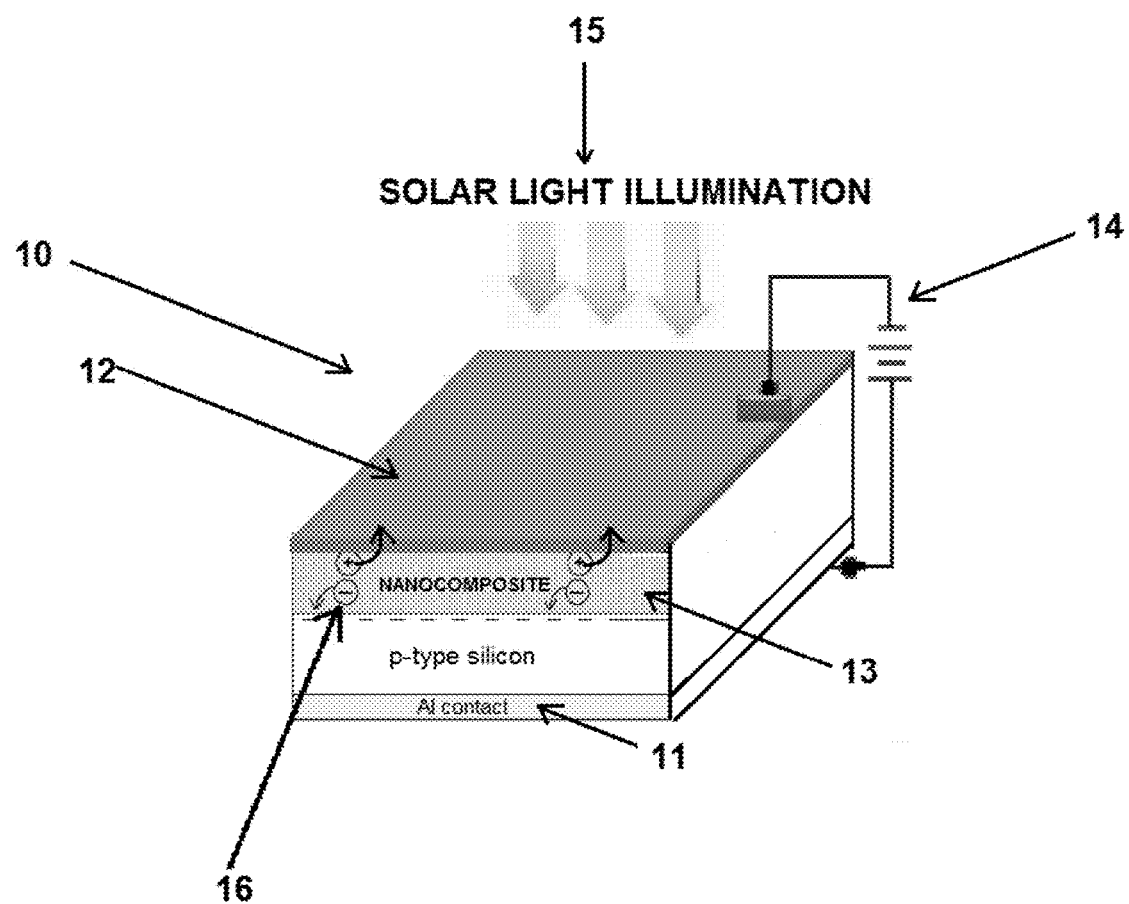
FIG. 1 is a schematic diagram of the nanocomposite photoresponse device.

Referring now to the drawings, wherein like reference numerals designate identical or corresponding parts throughout the several views.

The present invention is directed to a photodetector or photoresponse device having a photoactive layer comprising a nanocomposite formed on a substrate that converts light into current. The material of the nanocomposite photoactive layer becomes more electrically conductive due to the absorption of electromagnetic radiation such as solar light, including visible light, ultraviolet light, infrared light, or gamma radiation.

As used herein, electric current is a rate of flow of electric charge. Loosely bound electrons are considered as free electrons, capable of moving throughout the material, and considered the charge carriers. An electron hole ("hole") is the absence of an electron from a valence band and allows conceptualization of interactions between electrons and a nearly full system. The "holes" are the mobile positive charge carriers that are places where the semiconductor crystal is missing a valence electron.

In classical semiconductors, electrons can have energies only within certain ranges of levels of energy, termed bands. These bands are located energetically between the ground state (electrons are tightly bound to the atomic nuclei of the material) and the free electron energy (energy required for an electron to escape entirely from the material). The majority of low energy states (close to the nucleus) are occupied, up to a particular band called the valence band. In metals, conductors, the valence band is nearly filled with electrons under typical operating conditions. Semiconductors and insulators, in contrast, have very few (semiconductor) or virtually none (insulator) of their electrons available in the conduction bad, the band immediately above the valence band.

The ease with which electrons in a semiconductor material can be excited from the valence band to the conduction band depends upon the band gap, the energetic space between the bands. The size of this energy band gap serves as the dividing line (~4 eV) between semiconductors and insulators.

In band structure, the Fermi level can be considered the hypothetical energy level of an electron, thus at thermodynamic equilibrium this energy level would have a 50% probability of being occupied at any given time. It often describes the top of the collection of electron energy levels at absolute zero temperature, it is a ceiling that at absolute zero no electron will have enough energy to rise above. The Fermi energy is a quantum mechanics concept referring to the energy difference between the highest and lowest occupied single-particle states in a quantum system.

A semiconductor has electrical conductivity intermediate in magnitude between that of a conductor and insulator ($10^{-2}$-$10^{4}$ S/cm). In a semiconductor it may be more useful to think of the current as due to the flow of positive "holes". The current which flows in an intrinsic semiconductor consists of both electron and hole current. Electrons which have been freed from their lattice positions into the conduction band can move through the material. Additionally, electrons can jump between lattice positions to fill the vacancies left by the freed electrons. This additional mechanism is called hole conduction, it is as if the holes are migrating across the material in the direction opposite of the free electron movement.

In a semiconductor, there will be some electrons which are excited across the band gap into the conduction band at temperatures above absolute zero which can produce some current. The electron crossing the gap leaves behind an electron vacancy or hole. Under the influence of an external voltage, both the electron and the hole can move across the material. In a n-type semiconductor, the dopant contributes extra electrons, dramatically increasing the conductivity. In a p-type semiconductor the dopant produces extra vacancies or holes, which likewise increases the conductivity. The behavior of a p-n junction is the key to a variety of solid-state electronic devices and will be discussed herein.

The Fermi level is important in the band theory of solids. In doped semiconductors, p-type and n-type, the Fermi level is shifted by the impurities and their band gaps. In semiconductors the Fermi level lies in the band gap.

N-type semiconductors have a larger electron concentration than hole concentration. The phrase "n-type" describes the negative charge of the electron. In n-type semiconductors, electrons are the majority carriers and holes are the minority carriers. N-type semiconductors are created by doping an intrinsic semiconductor with donor impurities. A common dopant for n-type silicon is phosphorus. In an n-type semiconductor, the Fermi level is greater than that of the intrinsic semiconductor and lies closer to the conduction band than the valence band.

P-type semiconductors have a larger hole concentration than electron concentration. The phrase "p-type" describes the positive charge of the hole. In p-type semiconductors, holes are the majority carriers and electrons are the minority carriers. P-type semiconductors are created by doping an intrinsic semiconductor with acceptor impurities. A common p-type dopant for silicon is boron. For p-type semiconductors the Fermi level is below the intrinsic Fermi level and lies closer to the valence band than the conduction band.

Photocurrent is the electrical current through a photosensitive device, such as a photodiode, as the result of exposure to radiant power. The photocurrent may occur as a result of the photoelectric, photoemissive or photovoltaic effect. In the photovoltaic effect, when solar light or any other light is incident upon a material surface, the electrons present in the valence band absorb energy and, being excited, jump to the conduction band and become free. These highly excited, non-thermal electrons diffuse, and some reach a junction where they are accelerated into a different material by a built-in potential. This generates an electromotive force, and thus some of the light energy is converted into electric energy. In contrast, the photoelectric effect is when electrons are ejected from a material's surface into a vacuum upon exposure to light, generating some electric energy when the ejected electron is captured by another electrode. The photovoltaic effect differs as the excited electrons pass directly from one material to another, avoiding passing through a vacuum.

Referring to FIG. 1, the nanocomposite photoresponse device 10 includes a first metal electrode contact layer 11 having a low work function (cathode), a second metal electrode contact layer 12 having a high work function (anode). It also includes a photoactive nanocomposite layer 13 comprising nanoparticles, that serve as electron trapping particles, and an organic semiconductor matrix, that can serve as a photosensitizer, formed on a suitable substrate. The photoactive layer 13 is disposed or sandwiched between the cathode 11 and the anode 12 with the nanocomposite layer 13 in continuous contact with the anode 12 and the substrate in continuous contact with the cathode 12.

In a preferred embodiment, the photoactive nanocomposite layer 13 and the substrate layer form a heterojunction between p-Si and photosensitized n-ZnO with interfacial-trap controlled charge injection.

In a preferred embodiment, the nanocomposite photoresponse device 10 has a vertical structure; the cathode 11, the photoactive layer 13 and the anode 12 are stacked vertically. In contrast, a lateral structure places the cathode and the anode on the same side of the active layer and is also envisioned.

For purposes of the present invention, the term composite refers to a combination of two or more distinct constituent materials into one. The individual components, on an atomic level, remain separate and distinct within the finished structure. The materials may have different physical or chemical properties, that when combined, produce a material with characteristics different from the individual components. A composite is understood to comprise a bulk phase, termed the matrix, enclosing a reinforcing or filler phase.

As used herein, a nanocomposite is a multiphase solid material composite where one of the phases has one, two or three dimensions of less than 100 nanometers, or structures having nano-scale repeat distances between the different phases that make up the material. In the broadest sense this definition can include porous media, colloids, gels and copolymers, but is more usually taken to mean the solid combination of a bulk matrix and one or more nanodimensional filler phases differing in properties due to dissimilarities in structure and chemistry. In general, the mechanical, electrical, thermal, optical, electrochemical and catalytic properties of the nanocomposite will differ from that of the component materials.

Nanocomposites differ from conventional composite materials due to the exceptionally high surface to volume ratio of the filler phase and/or its exceptionally high aspect ratio. The aspect ratio of a nanomaterial is defined as the length of the major (long) axis divided by the width of the minor (short) axis. The filler phase can be made up of particles, sheets or fibers. The area of the interface between the matrix and filler phase or phases is typically an order of magnitude greater than for conventional composite materials.

Appropriately including nanoparticulates to a matrix can enhance its performance by simply capitalizing on the nature and properties of the nanoscale filler. This strategy is particularly effective in yielding high performance composites, when good dispersion of the filler is achieved and the properties of the nanoscale filler are substantially different or better than those of the matrix. Nanoscale dispersion of filler or controlled nanostructures in the composite can introduce new physical properties and novel behaviors that are absent in the unfilled matrices. This effectively changes the nature of the original matrix.

In a preferred embodiment, the photoresponse device comprises a nanocomposite photoactive layer with electron trapping particles dispersed throughout an organic semiconductor.

In a preferred embodiment the electron trapping particles are nanoparticles, more preferably metal oxide [zinc oxide (ZnO), tin oxide ($SnO_2$) or titanium oxide ($TiO_2$)] nanoparticles, most preferably zinc oxide (ZnO) nanoparticles.

In a preferred embodiment, the nanoparticles are zinc oxide (ZnO).

Nanoparticles are particles between 1 and 100 nm in size. A particle is defined as a small object that behaves as a whole unit with respect to its transport and properties. Zinc oxide nanoparticles are nanoparticles of zinc oxide, i.e. zinc oxide particles of between 1 nm and 100 nm in size.

Zinc oxide is an inorganic compound with the formula ZnO. ZnO is a white powder that is insoluble in water, and it is widely used as an additive in numerous materials and products including rubbers, plastics, ceramics, glass, cement, lubricants, paints, ointments, adhesives, sealants, pigments, foods, batteries, ferrites and fire retardants.

Zinc oxide crystallizes in two main forms, hexagonal wurtzite and cubic zincblende. The wurtzite structure is most stable at ambient conditions and thus most common. The zinc and oxide centers are tetrahedral. Hexagonal and zincblende polymorphs of ZnO have not inversion symmetry resulting in piezoelectricity.

Zinc oxide is a wide-bandgap semiconductor of the II-VI semiconductor group. This semiconductor has several favorable properties, including good transparency, high electron mobility, wide bandgap, and strong room-temperature luminescence. Zinc oxide (ZnO) is a preferred material for optoelectronic and transparent electronic applications due to its wide band gap (~3.3 eV), efficient ultraviolet (UV) emission ($\lambda$=380 nm), and large exciton binding energy (60 meV).

ZnO is intrinsically an n-type semiconductor due to oxygen vacancies and zinc interstitials. Nonstoichiometry is typically the origin of n-type character. Electron mobility of ZnO strongly varies with temperature and has a maximum of 2000 $cm^2/(V-s)$ at 80 K, data on hole mobility show values in the range of 5-30 $cm^2/(V-s)$. Most ZnO-based optoelectronic devices rely on heterojunctions between n-type ZnO and p-type semiconducting materials.

In a preferred embodiment, the nanoparticles are zinc oxide (ZnO) nanorods.

Nanostructures of ZnO can be synthesized into a variety of morphologies including, but not limited to nanowires, nanorods, tetrapods, nanobelts, nanoflowers, nanoparticles, nanospheres etc.

Nanoparticles are named for the real-world shapes that they appear to represent. The envisioned nanoparticles include, but are not limited to nanospheres, nanoreefs, nanotubes, nanocylinders, nanorods, nanoboxes and nanostars. These morphologies sometimes arise spontaneously as an effect of the synthesis or from the innate crystallographic growth patterns of the materials themselves. Some of these morphologies may serve a purpose, such as bridging an electrical junction.

Nanoparticle characterization is necessary to establish understanding and control of nanoparticle synthesis and applications. Characterization is done by using a variety of different techniques, mainly drawn from materials science. Common techniques include, but are not limited to, electron microscopy (TEM, SEM), atomic force microscopy (AFM), dynamic light scattering (DLS), X-ray photoelectron spectroscopy (XPS), powder X-ray diffraction (XRD), Fourier transform infrared spectroscopy (FTIR), matrix-assisted laser desorption/ionization time-of-flight mass spectrometry (MALDI-TOF), ultraviolet-visible spectroscopy, Rutherford backscattering spectrometry (RBS), dual polarization interferometry and nuclear magnetic resonance (NMR).

In one embodiment, the ZnO nanoparticles have an average size characterized by a longest dimension of 10-30 nm, preferably 10-25 nm, preferably 15-25 nm. The longest dimension refers to length, diameter and/or thickness.

In another embodiment, the nanoparticles are envisioned to be selected from the group including, but not limited to, titanium oxide (TiOx), tin oxide (SnOx), zinc sulfide (ZnS), cadmium sulfide (CdS), lead sulfides (PbS), iron sulfide (FeS), iron pyrite ($FeS_2$), cadmium selnide (CdSe), lead selenide (PbSe), cadmium telluride (CdTe), lead telluride (PbTe), Si, Ge, InAs, InSb, $Pb_1$, $Sn_xTe$, $Hg_{1-x}Cd_xTe$, InAsSb, InNSb, InBiTe, InTlSb, InAs/GaInSb super lattice, HgTe/CdTe super lattice, graphene quantum dots, carbon nanotube, or fullerene or mixtures and derivatives thereof.

In another embodiment, the photoresponse device is envisioned to comprise generic electron trapping material, or electron acceptor material, rather than nanoparticles. The material is envisioned to be selected from the group including, but not limited to, a fullerene and derivatives thereof, a perylene derivative, a 2,7-dicyclohexyl benzo, phenanthroline derivative, a 1,4-diketo-3,6-dithienylpyrrolo [3,4-c]pyrrole (DPP) derivative, a tetracyanoquinodimethane (TCNQ) derivative, indene-C60 bisadduct ([60]CBA), indene-C70 bisadduct ([70]CBA), a poly(p-pyridyl vinylene) (PPyV) derivative, a 9,9'-bifluorenylidene (99BF) derivative, a benzothiadiazole (BT) derivative, and combinations thereof, [6,6]-phenyl C61-butyric acid methyl ester (PCBM), [6,6]-phenyl C70-butyric acid methyl ester (PC70BM), [6,6]-(4-fluoro-phenyl)-C61-butyric acid methyl ester (FPCBM), carbon 60 (C60), carbon 70 (C70), carbon nanotube (CNT) and combinations thereof.

In a preferred embodiment the photoresponse device comprises a nanocomposite photoactive layer with nanoparticles dispersed throughout an organic semiconductor.

In a preferred embodiment, the organic semiconductor is a photosensitizer having high pi electrons, more preferably a coumarin-based photosensitizer, and most preferably coumarin.

In a preferred embodiment, the organic semiconductor is the photosensitizer coumarin.

Coumarin (1-benzopyran-2-one, $C_9H_6O_2$) is a fragrant organic compound in the benzopyrone chemical class, which is a colorless crystalline substance in its standard state. It is a natural substance found in many plants. Coumarin has been used as a gain medium in some dye lasers and as one of the early sensitizers in photovoltaic technologies.

In a preferred embodiment, the coumarin acts as a photosensitizing dye adsorbed onto the surface of the metal oxide semiconductors with the ability to inject an electron into the metal oxide semiconductor.

A number of different photosensitizers for metal oxide semiconductors have been examined, including both organic and inorganic complex chromophores. A carboxylate, phosphonate or sulfate group on the photosensitizer molecule enhances strong binding between the photosensitizer and the metal-oxide semiconductor surface.

In another embodiment, a photosensitizer can be selected from the group of 7-aminocoumarin chromophores having a carboxylate substituent at the 3-position including, but not limited to, Coumarin 343, Coumarin D-1421 and Coumarin D-126.

In another embodiment, a photosensitizer can be selected from the group including, but not limited to, organic laser dyes, porphyrin derivatives, inorganic complexes of ruthenium, osmium and iron, riboflavin, eosin, rose bengal, rhodamine B, and cyanine dyes.

In another embodiment, the organic semiconductor matrix is envisioned to be selected from the group including, but not limited to polyvinylcarbazole (PVK), poly(3-hexylthiophene) (P3HT), PBBDTTT-CT, phthalocyanine complex, a porphyrin complex, a polythiophene (PT), a derivative of polythiophene, a polycarbazole, a derivative of polycarbazole, a poly(p-phenylene vinylene) (PPV), a PPV derivative, a polyfulorene (PF), a benzodithiophene (BDT)-based polymer, a PF derivative, a cyclopentadithiophene-based polymer, a P3DOT, P3OT, PMeT, P3DDT, PDDTV, PQT, F8T2, PBTTT-C12, PFDDTBT, BisEH-PFDTBT, BisDMO-PFDTBT, PCDTBT or combinations and mixtures thereof.

The large reinforcement surface area in nanocomposites means that a relatively small amount of nanoscale reinforcement can have an observable effect on the macroscale properties of the composite. Nanoparticulates may result in improved electrical and thermal conductivity or enhanced optical properties, dielectric properties, heat resistance or mechanical properties such as stiffness, strength and resistance to wear and damage.

Generally, the nano reinforcement or filler is dispersed into the matrix during processing. The percentage by weight (mass fraction or mass ratio) of the nanoparticulates introduced can remain very low (on the order of 0.5% to 5% or 15%) due to the low filler percolation threshold, especially for non-spherical, high aspect ratio fillers such as nanometer-thin platelets, clays, cylinders, rods, or tubes.

As defined herein, percolation threshold is a mathematical concept related to the formation of long-range connectivity in random systems. Below the threshold a giant connected component does not exist; while above it, there exists a giant component of the order of the system size.

In a preferred embodiment, zinc oxide and coumarin are combined at specific molar ratios. In one preferred embodiment, the zinc oxide and coumarin are present in the nanocomposite at a molar ratio of 1:10. In another preferred embodiment, the ratio may be 1:500, 1:200, 1:100, 3:100, 1:10 or 1:5.

In another embodiment, the nanoparticles can be dispersed in the organic semiconductor such that the nanoparticles do not contact one another. In this manner the nanoparticles form isolated electron traps.

In another embodiment, the nanoparticles are envisioned to have defects or to be coated with nonconductive ligands aiding the nanoparticles in functioning as charge trappers.

The use of nanoparticles in nanocomposites leads to changes in both physical and chemical properties. Two of the major factors in this are the increase in the ratio of surface area to volume, and the size of the particle. The increase in surface area to volume ratio, which increases as particles get smaller, leads to an increasing dominance of the behavior of atoms on the surface of the particle over that of those interior to the particle. This affects the properties of the particles when interacting with other particles within the mixture and can increase many factors in the mixture.

Materials that use the properties of low-dimensional objects, such as nanoparticles in nanocomposites, are promising for the ability to tailor a number of properties. Electrophysical, optical and magnetic properties are tunable by changing the size of nanoparticles, which can be controlled during the synthesis. The effects of the filler reinforcement are dependent on the nanostructure morphology, defects and dispersion of the nanomaterials in the matrix. Nanostructured electronic devices benefit from the advantages of large-surface-to-volume ratio and modified light-matter interaction.

In another embodiment, the photoresponse device can be manipulated by the metal oxide or nanoparticle content.

In another embodiment, the absorption of the photoactive layer of the photoresponse device can be controlled by the molar ratios of the nanoparticles and organic semiconductor.

In a preferred embodiment, the first metal electrode contact layer 11 (cathode) has a low work function, more preferably the cathode is aluminum (Al).

In another embodiment, the first metal electrode contact layer 11, having a low work function (cathode), is envisioned to be selected from the group including, but not limited to, aluminum, calcium, magnesium, lithium, sodium, potassium, strontium, cesium, barium, iron, cobalt, nickel, copper, silver, zinc, tin, samarium, ytterbium, chromium, gold, graphene, an alkali metal fluoride, an alkaline-earth metal fluoride, an alkali metal chloride, an alkaline-earth metal chloride, an alkali metal oxide, an alkaline-earth metal oxide, a metal carbonate, a metal acetate or a combination of two or more thereof.

In a preferred embodiment, the second metal electrode contact layer 12 (anode) has a high work function, more preferably the anode is gold (Au).

In another embodiment, the second metal electrode contact layer 12, having a high work function (anode), is envisioned to be selected from the group including, but not limited to, aluminum, calcium, magnesium, lithium, sodium, potassium, strontium, cesium, barium, iron, cobalt, nickel, copper, silver, zinc, tin, samarium, ytterbium, chromium, gold, graphene, an alkali metal fluoride, an alkaline-earth metal fluoride, an alkali metal chloride, an alkaline-earth metal chloride, an alkali metal oxide, an alkaline-earth metal oxide, a metal carbonate, a metal acetate or a combination of two or more thereof.

In another embodiment, the anode is transparent or partially transparent and is envisioned to be selected from the group including, but not limited to, indium tin oxide (ITO), fluorine-doped tin oxide (FTO), aluminum-doped zinc oxide (AZO), highly conductive polymer, networks of metal or carbon nanowire, nanotube, nanosheet or nanorod, carbon nanotube, silver nanowire and graphene and combinations thereof. Additionally, transparent substrates such as glass and/or plastic may be deposited on the transparent anode.

In another embodiment, the photoactive layer can absorb light having a first specified wavelength, the anode can be transparent or partially transparent to light having a second specified wavelength overlapping the first specified wavelength in a third specified wavelength.

In another embodiment, the organic semiconductor can be selected based on the spectrum of solar light that the photoresponse device is intended to detect. The detection wavelength can be controlled by the optical band gap of the organic semiconductor.

In one embodiment, the work function of certain materials are taken as aluminum=4.06-4.26 eV, gold=5.1-5.47 eV and indium tin oxide=4.7-4.8 eV. The work function depends on the configurations of atoms at the surface of the material.

As used herein, the solid-state physics definition of work function refers to the minimum thermodynamic work (i.e. energy) needed to remove an electron from a solid to a point in the vacuum immediately outside the solid surface on an atomic scale. The work function is not a characteristic of a bulk material, but rather a property of the surface of the material. In general, the work function tends to be smaller for metals with an open lattice, and larger for metals in which the atoms are closely packed. It is somewhat higher on dense crystal faces than open crystal faces, also depending on surface reconstructions for the given crystal face. Work function can also be determined by physical factors including, but not limited to, surface dipoles, doping and electric field effects.

As used herein, the anode of a device is the terminal where current flows in from outside. The cathode of a device is the terminal where current flows out. An anode is an electrode through which electric current flows into a polarized electrical device. The direction of electric current is opposite to the direction of electron flow: electrons flow through the anode to the outside circuit. The polarity of voltage on anode with respect to an associated cathode varies depending on the device type and its operating mode. The anode is positive in a device that consumes power, and the anode is negative in a device that provides power. A cathode is the electrode from which a conventional current leaves a polarized electrical device. A conventional current describes the direction in which positive electronic charges move. Electrons have a negative charge, so the movement of electrons is opposite to the conventional current flow. Electrons flow into the device's cathode. Cathode polarity depends on the device type, and can vary according to the operating mode. In a device which consumes power, the cathode is negative, and in a device which provides power, the cathode is positive.

In a preferred embodiment, the substrate layer is a p-type semiconductor, more preferably p-type doped silicon or germanium, and most preferably p-type silicon.

In another embodiment, the p-type semiconductor substrate layer is envisioned to be selected from the group including, but not limited to, group IV semiconductors silicon or germanium doped with acceptor atoms boron, aluminum or gallium and/or group III-V semiconductors aluminum phosphide, aluminum arsenide, gallium arsenide or gallium nitride doped with acceptor atoms beryllium, zinc, cadmium, silicon or germanium.

The addition of a small percentage of foreign atoms in a regular crystal lattice of an intrinsic semiconductor (i.e. silicon or germanium) produces dramatic changes in their electrical properties, producing n-type and p-type semiconductors. Impurity atoms with 3 valence electrons like Boron (B) or Gallium (Ga) produce p-type semiconductors by producing a "hole" of electron deficiency.

The addition of trivalent impurities including, but not limited to, boron, aluminum or gallium to an intrinsic semiconductor creates deficiencies of valence electrons, called "holes". Typically, $B_2H_6$ diborane gas can be used to diffuse boron into silicon material.

The application of band theory to n-type and p-type semiconductors shows that extra levels have been added by the impurities. In n-type material there are electron energy levels near the top of the band gap so that they can be easily excited into the conduction band. In p-type material, extra holes in the bad gap allow excitation of valence band electrons, leaving mobile holes in the valence band.

In a preferred embodiment, the photoactive nanocomposite layer 13 and the substrate layer form a heterojunction between p-Si and coumarin photosensitized n-ZnO with interfacial-trap controlled charge injection.

For the purposes of the present invention, a p-n junction is a boundary or interface between two types of semiconductor material, p-type and n-type. Specifically, current will flow readily in one direction but not the other, creating the basic diode. This non-reversing behavior arises from the nature of the charge transfer process in the two types of material.

Near the junction, electrons which have reached the conduction band diffuse across to combine with holes, creating a depletion region. The combining of electrons and holes depletes the holes in the p-region and the electrons in the n-region near the junction. A space charge builds up, creating a depletion region which inhibits further electron transfer unless it is helped by a bias on the junction.

In forward bias, driving the cathode negative with respect to the anode, the applied voltage further impedes the flow of electrons across the junction. For conduction in the device, electrons from the N-region must move to the junction and combine with holes in the P-region. This voltage drives the electrons away from the junction.

In reverse bias, driving the cathode positive with respect to the anode, the applied voltage assists electrons in overcoming the barrier of the space charge in the depletion region. Electrons move with very small resistance in this direction.

FIG. 1 shows a schematic diagram of the photoresponse device.

In a preferred embodiment, the photoresponse device is a vertical structure photodiode 10. The photoresponse device includes a metal cathode 11, a metal anode, 12 and a nanocomposite photoactive layer 13 formed on a p-Si substrate. The nanocomposite photoactive layer comprises ZnO nanoparticles dispersed in coumarin as a photosensitizing organic semiconductor.

In a preferred embodiment, a bias voltage 14 is applied to the bottom and top metal electrodes.

In a preferred embodiment, the photodiode device is illuminated by solar light 15. The solar light generates the charge carriers in the depletion region of the device. The electron-hole pairs 16 are generated in the nanocomposite photoactive layer. Increasing the intensity of illumination increases the generation of charge carriers.

In a preferred embodiment, when the photoresponse device is not illuminated by light, it operates as a photodiode possessing a Schottky rectifying contact. The Schottky photodiode can be controlled using incident light and voltage simultaneously. In a second instance, when the photoresponse device is illuminated by light, it operates in a first photoconductor mode and a second photocapacitor mode, both possessing an Ohmic contact.

As used herein, a Schottky diode, also known as a hot carrier diode, is a semiconductor diode with a low forward voltage drop and a very fast switching action. A Schottky barrier is a potential energy barrier for electrons formed at a semiconductor junction. Schottky barriers have rectifying characteristics, suitable for use as a diode. The Schottky barrier height ($\phi_B$) is the primary characteristic of the Schottky barrier and depends on the characteristics of the combining materials. Not all semiconductor junctions form a rectifying Schottky barrier; a metal-semiconductor junction that conducts current in both directions without rectification, perhaps due to the Schottky barrier being too low, is termed an ohmic contact.

Figure 2A:
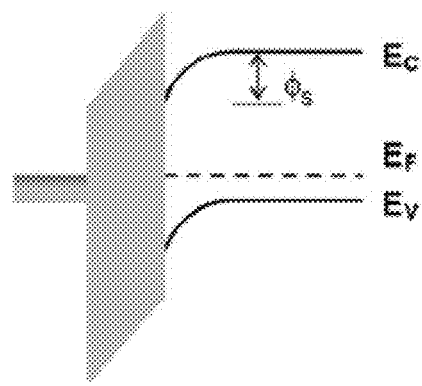
FIG. 2A is an energy band diagram of the photoresponse system under dark conditions.
Figure 2B:
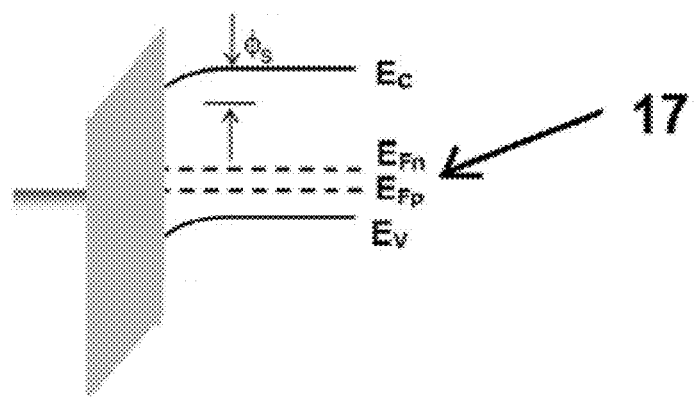
FIG. 2B is an energy band diagram of the photoresponse system under illuminated conditions.

When the photoresponse device 10 is illuminated by light 15, the organic semiconductor and nanoparticles absorb incident photons and generate Frenkel excitons 16. These excitons diffuse to the interface of the nanoparticles and organic semiconductor. The holes transport in the organic semiconductor under the applied reverse bias, and the electrons can remain trapped in the nanoparticles As demonstrated in FIG. 2A, when not illuminated, the dark current is small as a result of a large charge injection barrier (>5.0 eV) under reverse bias. When the photoresponse device is illuminated, the trapped electrons quickly shift the lowest unoccupied molecular orbital (LUMO) of the organic semiconductor downward and align the Fermi energy of the nanocomposite photoactive layer with that of the electrode. Under illumination, the photoresponse device increases the number of photogenerated charges and splits the hole and electron quasi Fermi levels, $E_{fp}$ and $E_{fn}$, 17 in FIG. 2B. The thickness of the hole-injection barrier can become so small the holes can easily tunnel through at a small reverse bias.

As used herein, a photodiode is a semiconductor device that converts light into current. The current is generated when photons are absorbed in the photodiode. A small amount of current, termed dark current, is also produced when no light is present.

A photodiode is a p-n junction. When a photon of sufficient energy strikes the diode, it creates and electron-hole pair, termed the inner photoelectric effect. If the absorption occurs in the junctions's depletion region, or one diffusion length away from it, these carriers are swept from the junction by the built-in electric field of the depletion region. Thus, holes move toward the anode, and electrons toward the cathode, and a photocurrent is produced. The total current through the photodiode is the sum of the dark current, generated in the absence of light, and the photocurrent. The dark current should be minimized to maximize the sensitivity of the device.

In a preferred embodiment, the photoresponse device operates in a photoconductor first mode when illuminated.

In a preferred embodiment, the photoconductor can be controlled using light and voltage simultaneously.

In the first photoconductive mode the diode is often reverse biased. The cathode is driven positive with respect to the anode. This reduces the response time because the additional reverse bias increases the width of the depletion layer.

In a preferred embodiment, the photoresponse device demonstrates a photocurrent gain, ratio of illuminated current to dark current, in photoconductor mode of at least 3000 at 4V.

In a preferred embodiment, the photoresponse device demonstrates a responsivity of at least 0.1 A/W.

In a preferred embodiment, the photoresponse device operates in a photocapacitor second mode when illuminated.

In a preferred embodiment, the photocapacitor can be controlled using light and frequency simultaneously.

As used herein, a capacitor is a device that stores energy in the electric field created between a pair of semiconductors on which electric charges have been placed. The capacitance value, or amount of charge that can be stored, is directly proportional to the permittivity of the dielectric material that separates the conductors of the capacitor.

In the second photocapacitance mode the diode operates under reverse bias. The flow of photocurrent out of the device is restricted and a voltage builds up. The depletion layer between the n- and p-sides of the p-n junction serves as an insulating region that separates the two contacts. Thus, the diode exhibits a depletion-layer capacitance or junction capacitance, analogous to a parallel plate capacitor with a dielectric spacer between the contacts. In reverse bias, the width of the depletion layer is widened with increasing reverse bias and the capacitance is accordingly decreased.

In a preferred embodiment, the photoresponse device demonstrates a photocapacitance gain, ratio of illuminated capacitance to dark capacitance, in photocapacitor mode of at least 50 at 10 Hz.

Factors to consider in the performance of the photoresponse device include responsivity, dark current, response time and noise equivalent power. The spectral responsivity is a ratio of the generated photocurrent to incident light power.

In a second aspect, the present invention relates to a method for the production of the nanocomposite photoactive layer described herein and the photoresponse device described herein.

In a preferred embodiment, the simple, efficient and environmentally benign hydrothermal cell assisted sol-gel techniques is used for the fabrication of the ZnO nanorods.

In a preferred embodiment, the zinc oxide nanorods are sourced from zinc nitrate hexahydrate and urea in aqueous hydrothermal conditions, mixed with coumarin and coated onto the surface of the p-type silicon substrate by a drop casting method.

In another embodiment, the nanocomposites can be prepared using alcohol based metal oxide solutions for mixing with the organic semiconductor. Alcohol solvents are envisioned to be selected from the group including, but not limited to, ethanol, methanol, and 2-methoxyethanol.

Rodlike nanostructures of ZnO can be produced via aqueous methods. These methods are low cost, less hazardous and thus capable of easy scaling up. The growth occurs at a relatively low temperature and is compatible with flexible organic substrates. There is no need for the use of metal catalysts, and thus it can be integrated with well-developed silicon technologies. In addition, there are a variety of parameters that can be tuned to effectively control the morphology and properties of the final product.

Wet chemistry methods have been demonstrates as a powerful and versatile technique for growing ZnO nanostructures. The synthesis is typically carried out at temperatures above 90° C., in an equimolar aqueous solution of zinc nitrate and hexamine, the latter providing the basic environment.

In another embodiment certain additives such as polyethylene glycol or polyethylenimine can improve the aspect ratio of the ZnO nanoparticles. Doping of the ZnO nanoparticles can also be achieved by the addition of other metal nitrates to the growth solution. The morphology of ZnO nanostructures can be tuned by changing the parameters of their fabrication relating to precursor composition (zinc concentration and pH) or to the thermal treatment (temperature and heating rate).

In another embodiment, higher cost techniques that provide less control over nanosize and morphology are envisioned. These include co-sputtering, molecular beam epitaxialation (MBE), laser ablations, and chemical vapor deposition (CVD) techniques.

In a third aspect, the present invention relates to an electronic device comprising the photoresponse device described herein.

In a preferred embodiment, the photoresponse device can be used as a photodetector. A bias voltage can be applied across the cathode and the anode, with the nanocomposite photoactive layer described herein disposed between them. When light is transmitted to the photoactive layer it can be detected by an increased current flowing through the photodetector.

In another embodiment, a photodetector array is envisioned including individually selectable anode lines and individually selectable cathode lines running perpendicular with the photoactive layer described herein disposed between them. In this manner, each intersection of one of the anode lines and one of the cathode lines forms an individually selectable photodetector. These photodetectors offer applications in fiberoptic communication, safety and security, process control, environmental sensing, astronomy and defense.

In another embodiment, the photoresponse device described herein can have rolled-up or spiral structure. This is envisioned to function as a radiation detector with the ability to x-rays, gamma rays or neutrons.

In another embodiment, the photoresponse device is envisioned to have applications in a number of different non-limiting circuits. In cameras this includes light meters, automatic shutter control, auto-focus or photographic flash control. In medicine, this includes CAT scanners, X-ray detection, pulse oximeters, blood particle analyzers. In communications, this includes fiber optic links, optical remote controls, and optical communications. In safety, this includes smoke detectors, flame monitors, intruder alert security systems, security inspection systems. In industrial settings, this includes bar code scanners, light pens, brightness controls, encoders, positions sensors, surveying instruments or copiers. In the automotive industry, this includes headlight dimmers, twilight detectors, or climate control-sunlight detectors.

The examples below are intended to further illustrate protocols for preparing and assessing the ZnO nanoparticles, photoactive nanocomposite layer and photoresponse device described herein, and are not intended to limit the scope of the claims.

Example 1

Preparation of ZnO Nanoparticles and the Photoactive Nanocomposite Layer

The chemicals used in various embodiments of the present invention were supplied by Aldrich company as analytical grade reagents. The raw materials were used as purchased without further purification. Millipore MilliQ purified deionized water was used in all operations.

An aqueous solution of 50 mL total volume containing 0.25 mol of zinc nitrate hexahydrate, $Zn(NO_3)_2 \cdot 6H_2O$, and 0.4 mol urea was prepared at room temperature. The mixture was vigorously magnetically stirred for 10 min and then transferred to a Teflon-lined steel autoclave of 50 mL capacity. The steel autoclave was sealed and the hydrothermal cell kept at 220° C. for 3 h. After the cooling of the autoclave to room temperature solid product of naturally white precipitates were filtered and rinsed with water up to pH=7. The obtained powders were dried in an oven at 80° C. overnight.

Subsequently, the synthesized ZnO nanorods were dispersed in 10 mL deionized water (1.5 mg/mL) and stirred for approximately 10 min. The coumarin was dissolved in 10 mL dichlorobenzene. The corresponding molar ratios of ZnO (1:200, 1:100, 3:100 and 10:100) solution in deionized water were added to the coumarin solution in dichlorobenzene and stirred under ultrasonic irradiation for 10 min. Finally, the films of ZnO/coumarin were coated onto the surface of p-type silicon substrate using a drop casting method.

Example 2

Characterizations of the Prepared ZnO Nanoparticles and the Photoactive Nanocomposite Layer The results obtained from a variety of relevant instrumental studies of the as synthesized pure ZnO nanoparticles and photoactive nanocomposite layer, to offer insights into the morphology and electrical properties, are laid out in the following examples.

Example 3

X-Ray Diffraction (XRD) Analysis of the Prepared ZnO Nanoparticles

Figure 3:
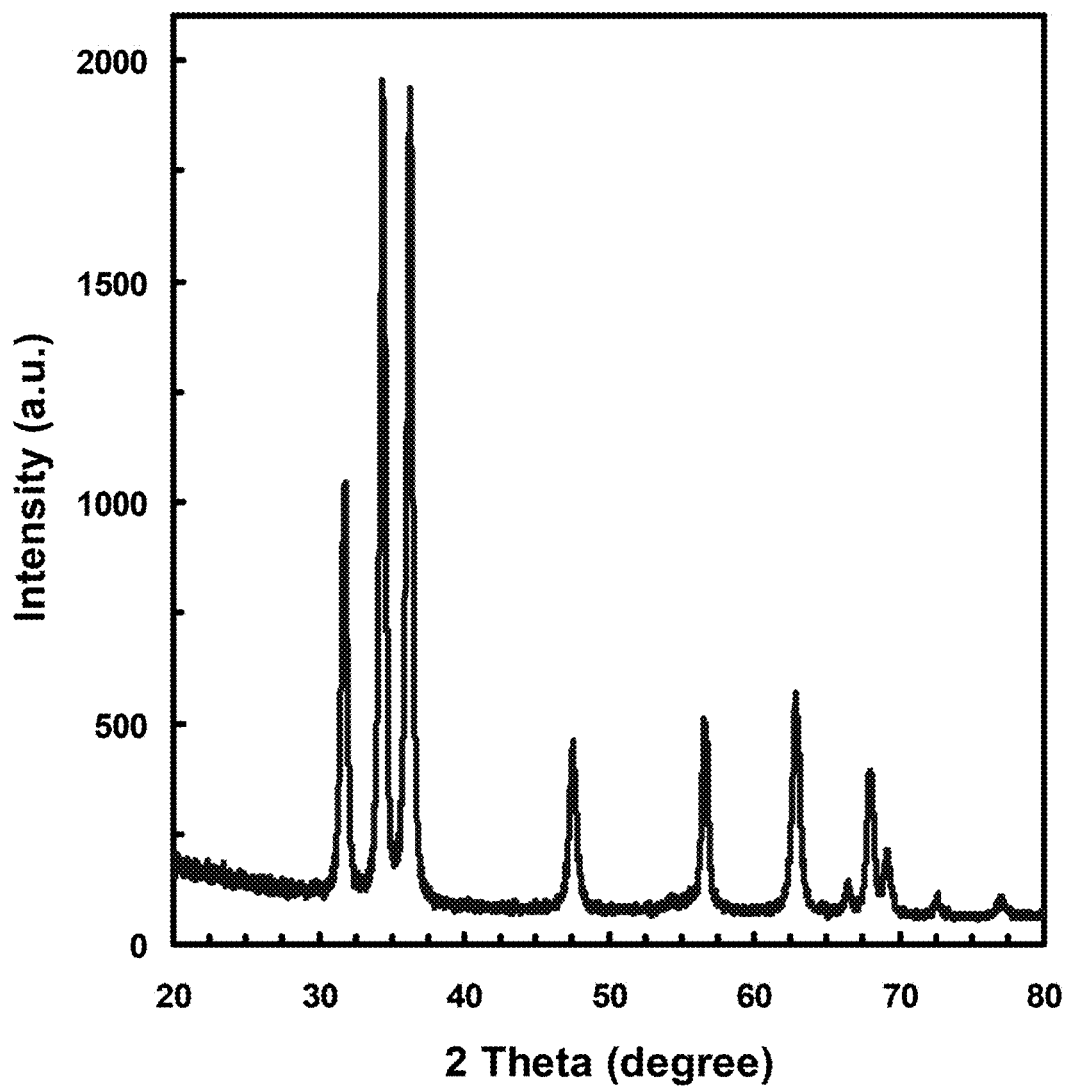
FIG. 3 is an X-ray diffraction pattern of the as synthesized zinc oxide nanoparticles.

The crystal structure of ZnO nanoparticles was characterized by X-Ray diffraction (XRD) with Cu K$\alpha$ radiation ($\lambda$=0.15418 nm). FIG. 3 shows XRD patterns of ZnO nanoparticles. The peaks at 2$\theta$=31.67°, 34.31°, 36.14°, 47.40°, 56.52°, 62.73°, 66.28°, 67.91°, 69.03°, and 72.48° were assigned to (100), (002), (101), (102), (110), (103), (200), (112), (201), and (004) of ZnO nanoparticles, indicating that the samples were polycrystalline wurtzite structure (Zincite, JCPDS 5-0664). No characteristic peaks of any impurities were detected, suggesting that high-quality ZnO nanoparticles were synthesized.

Example 4

Scanning Electron Microscopy (SEM) and Transmission Electron Microscopy (TEM) Analysis of the Prepared ZnO Nanoparticles The surface morphology of the as synthesized pure ZnO nanoparticles was observed and studied at high and low magnification by a scanning electron microscope (SEM).

Figure 4:
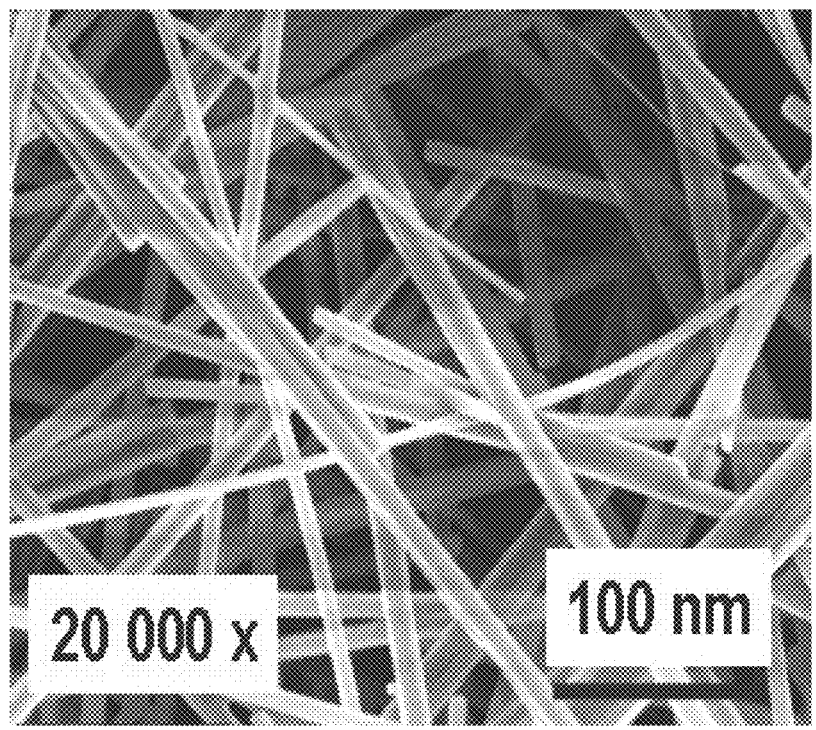
FIG. 4 is a scanning electron microscope (SEM) micrograph of the as synthesized zinc oxide nanoparticles.

FIG. 4 shows the typical low magnification (20000× magnification) micrograph of the as synthesized ZnO nanoparticles. The micrograph demonstrates that the prepared ZnO nanoparticles possess uniform nanorod-shaped morphology and that the ZnO nanoplatelets are formed in high yield. The micrograph shows that the average diameter and length of the as prepared ZnO nanorods are about 15-25 nm.

Figure 5:
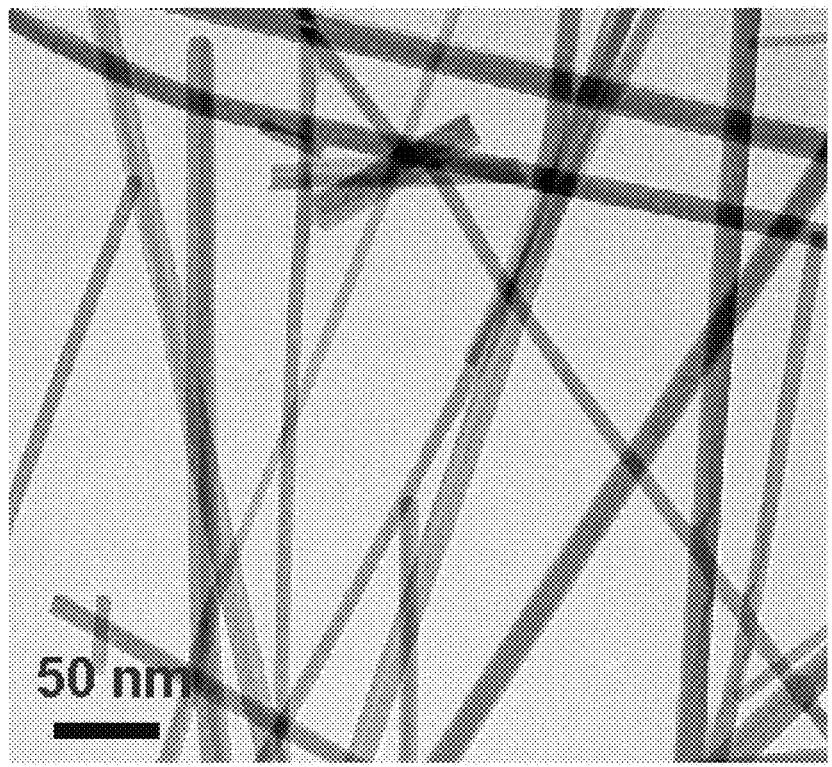
FIG. 5 is a transmission electron microscope (TEM) micrograph of the as synthesized zinc oxide nanoparticles.

Detailed morphology of the as synthesized ZnO nanoparticles was examined by a transmission electron microscope (TEM). FIG. 5 shows the typical low resolution TEM micrograph of the as synthesized ZnO nanoparticles. The nanorods have an average diameter of 16-20 nm. It is also apparent that the nanosheets are synthesized in large quantity. All the TEM observations regarding shape, size and thickness are well matched with the obtained FESEM results.

Example 5

Energy-Dispersive X-Ray Spectroscopy (EDS) of the Prepared ZnO Nanoparticles

Figure 6:
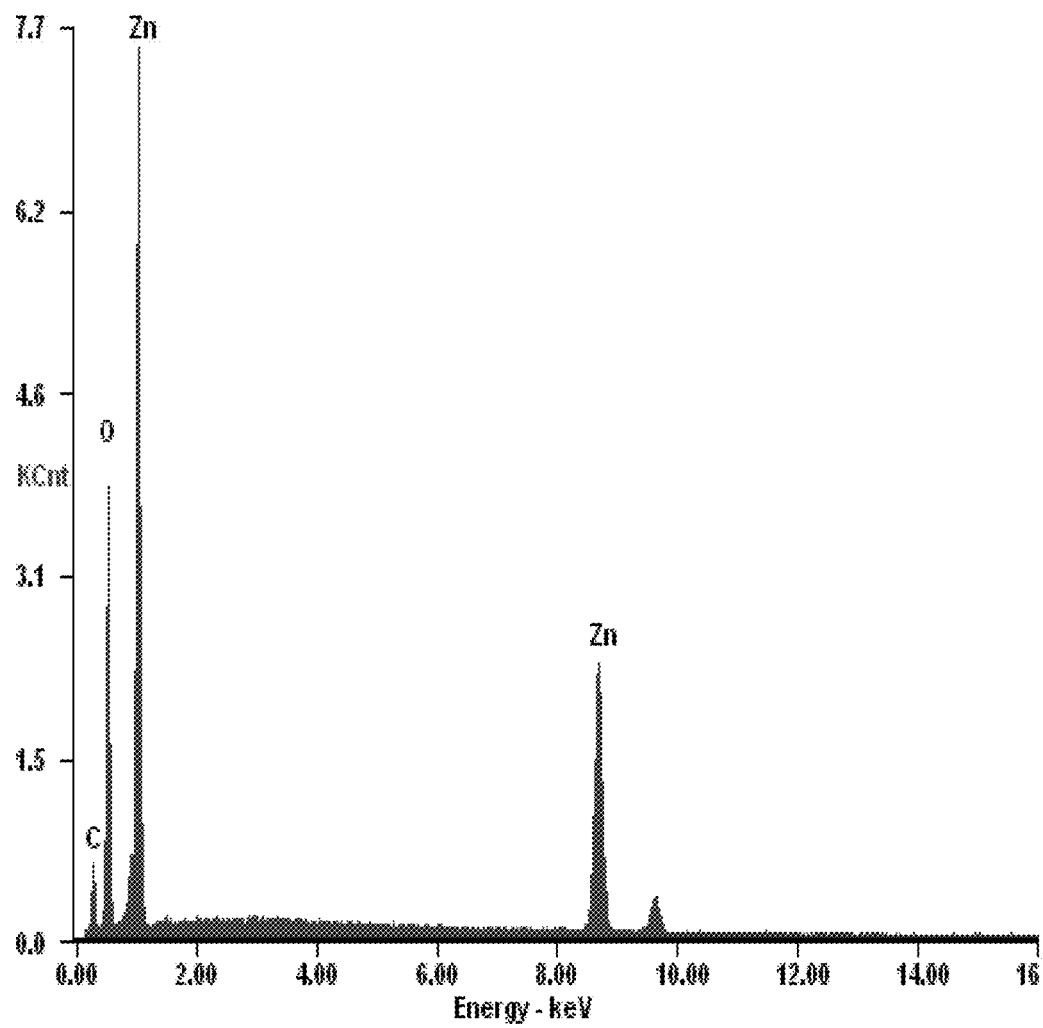
FIG. 6 is an energy-dispersive X-ray spectroscopy (EDS) spectrum of the as synthesized zinc oxide nanoparticles
Figure 7:
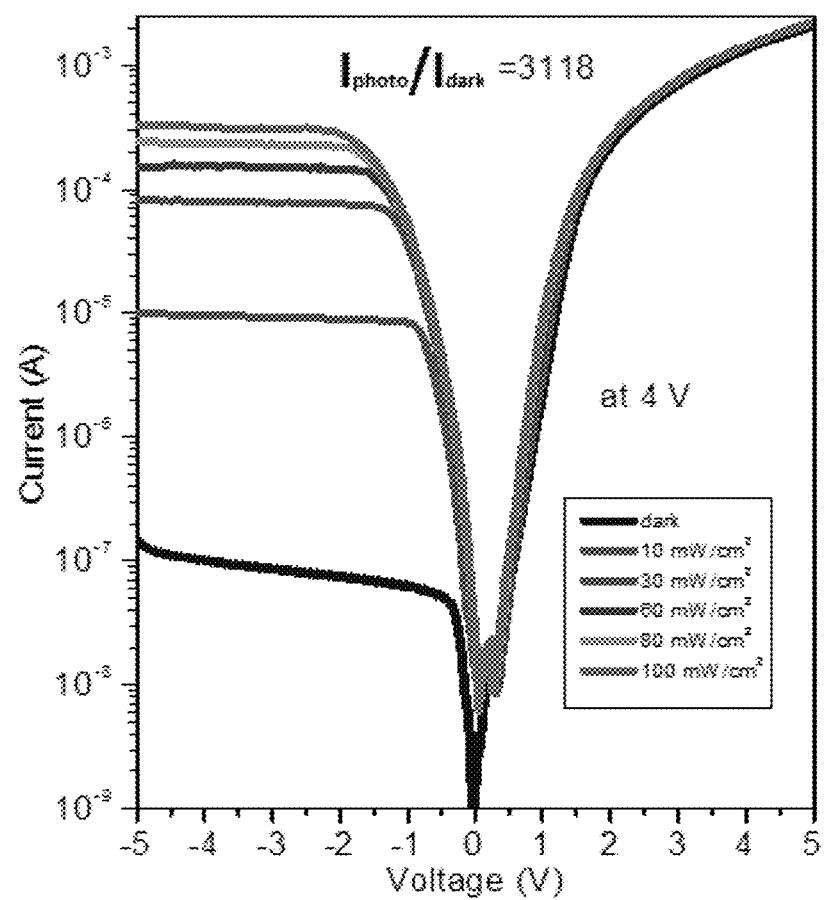
FIG. 7 illustrates the photocurrent and dark current of the nanocomposite photoresponse device under various illumination intensities of solar light.
Figure 8:
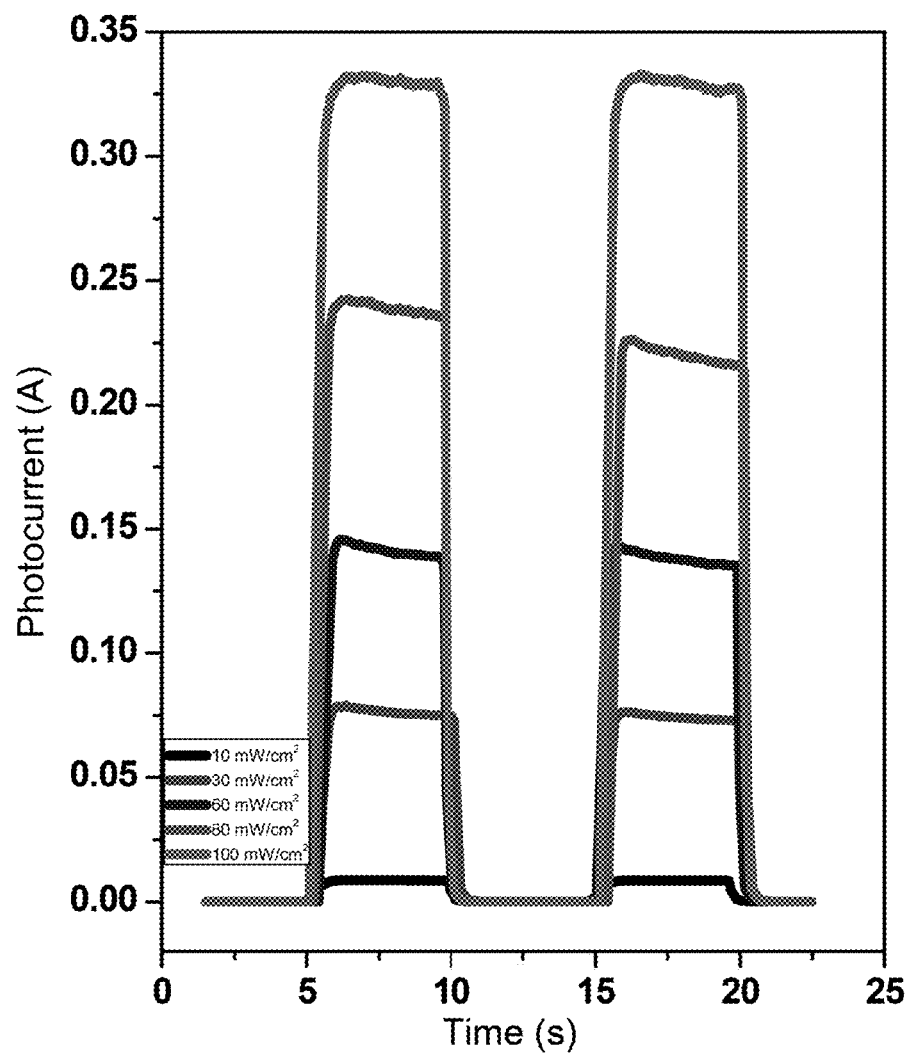
FIG. 8 illustrates the photocurrent versus time of the nanocomposite photoresponse device under illumination turned on and off.
Figure 9:
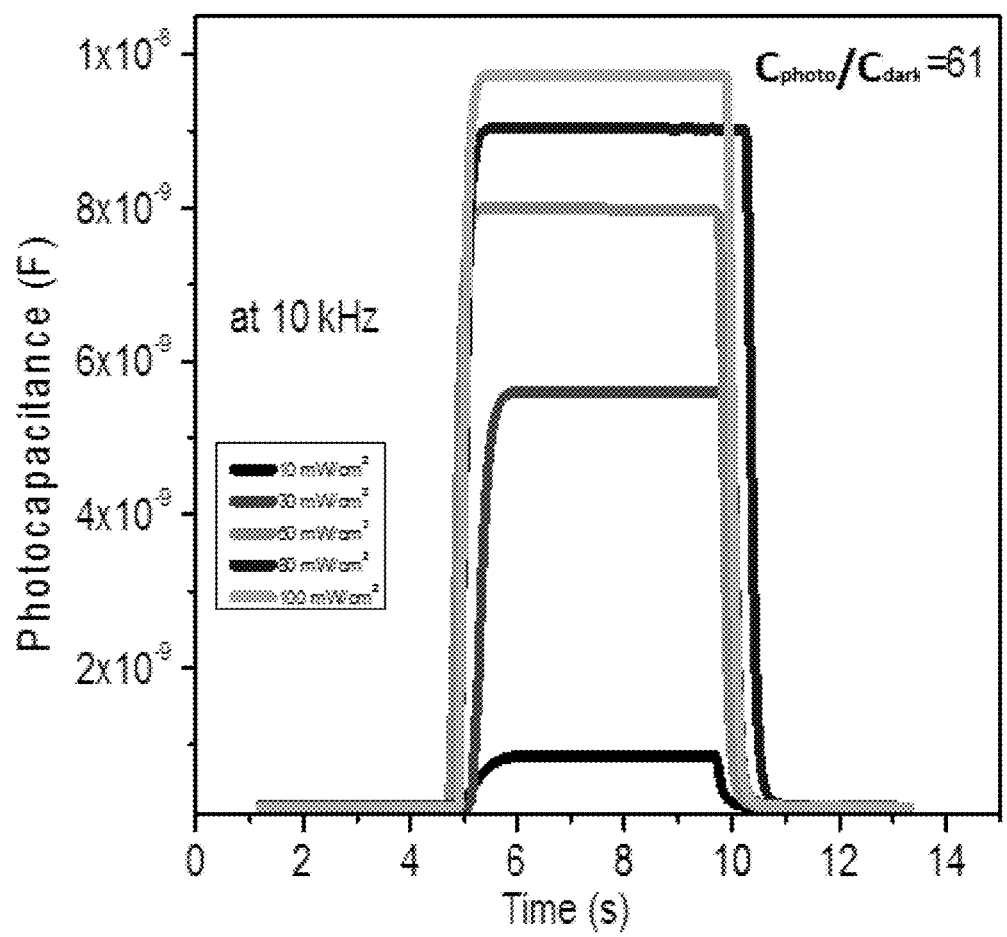
FIG. 9 illustrates the photocapacitance versus time of the nanocomposite photoresponse device under illumination turned on and off.

To further confirm the composition of the as synthesized ZnO nanorods, EDX analysis was performed. FIG. 6 demonstrates the typical EDX analysis of the as synthesized ZnO nanorods. It is confirmed from the EDX analysis that the grown nanorods are composed of zinc and oxygen only. The molecular ratio of Zn:O in the grown nanorods, calculated from EDX and quantitative analysis data, is close to that of 1:1. Except Zn and O, no other peak for any other element has been found in the spectrum which again confirmed that the grown nanorods are pure ZnO.

Thus, the foregoing discussion discloses and describes merely exemplary embodiments of the present invention. As will be understood by those skilled in the art, the present invention may be embodied in other specific forms without departing from the spirit or essential characteristics thereof. Accordingly, the disclosure of the present invention is intended to be illustrative, but not limiting of the scope of the invention, as well as other claims. The disclosure, including any readily discernible variants of the teachings herein, defines, in part, the scope of the foregoing claim terminology such that no inventive subject matter is dedicated to the public.

The invention claimed is:

1. A photoresponse device, comprising;
    a first metal contact layer having a low work function,
    a substrate layer in continuous contact with the first metal contact layer,
    a nanocomposite layer in continuous contact with the substrate layer,
    a second metal contact layer having a high work function in continuous contact with the nanocomposite layer, wherein the second metal contact layer is gold,
    wherein, the nanocomposite layer comprises metal oxide nanoparticles dispersed in an organic semiconductor.

2. The photoresponse device of claim 1, wherein a molar ratio of the metal oxide nanoparticles to the organic semiconductor is 1:500-1:5.

3. The photoresponse device of claim 1, wherein the metal oxide nanoparticles are zinc oxide nanorods.

4. The photoresponse device of claim 1, wherein the organic semiconductor is coumarin.

5. The photoresponse device of claim 1, wherein the low work function first metal contact layer is aluminum.

6. The photoresponse device of claim 1, wherein the substrate layer comprises a p-type doped silicon semiconductor.

7. The photoresponse device of claim 1, wherein the device is a Schottky photodiode when not illuminated.

8. The photoresponse device of claim 7, wherein the Schottky photodiode is controlled using light and voltage simultaneously.

9. The photoresponse device of claim 1, wherein the device is a photoconductor in a first mode when illuminated.

10. The photoresponse device of claim 9, wherein the photoconductor is controlled using light and voltage simultaneously.

11. The photoresponse device of claim 9, wherein the photoconductor has a sensitivity, the ratio of illuminate current to dark current of at least 3000 at 4V.

12. The photoresponse device of claim 9, wherein the photoconductor has photoresponsivity of at least 0.1 A/W.

13. The photoresponse device of claim 1, wherein the device is a photocapacitor in a second mode when illuminated.

14. The photoresponse device of claim 13, wherein the photocapacitor is controlled using light and voltage simultaneously.

15. The photoresponse device of claim 13, wherein the photocapacitor has a photocapacitance gain, the ratio of illuminated capacitance to dark capacitance, of at least 60 at 10 Hz.

16. The photoresponse device of claim 1, wherein:
the metal oxide nanoparticles are zinc oxide nanoparticles with a longest dimension of 10-30 nm;
the organic semiconductor is coumarin;
the substrate layer comprises a p-type doped silicon semiconductor; and
a molar ratio of the zinc oxide nanoparticles to the coumarin is 1:500-1:5.

17. The photoresponse device of claim 16, wherein the p-type doped silicon semiconductor is silicon doped with boron, aluminum, or gallium, and wherein the molar ratio of the zinc oxide nanoparticles to the coumarin is 1:10-1:5.

18. A method of making the photoresponse device of claim 1, comprising:
mixing metal oxide nanoparticles, organic semiconductor and a solvent to form a suspension, then
drop casting the suspension onto the substrate layer, then
evaporating the solvent to form the nanocomposite layer on the substrate layer, then
sandwiching the nanocomposite layer and the substrate layer between the first metal contact and the second metal contact, wherein the nanocomposite layer is in direct and continuous contact with the substrate layer and the second metal contact layer.

19. An electronic device, comprising the photoresponse device of claim 1, wherein the photoresponse device is present in said electronic device.

* * * * *